United States Patent
Briff et al.

(10) Patent No.: US 12,142,913 B2
(45) Date of Patent: Nov. 12, 2024

(54) ELECTRICAL ASSEMBLY HAVING A CHARACTERIZED ELECTRICAL PARAMETER

(71) Applicant: General Electric Technology GmbH, Baden (CH)

(72) Inventors: Pablo Briff, Stafford (GB); Huy Quoc Si Dang, Stafford (GB); Richard Zhang, Stafford (GB)

(73) Assignee: GE INFRASTRUCTURE TECHNOLOGY LLC, Greenville, SC (US)

( * ) Notice: Subject to any disclaimer, the term of this patent is extended or adjusted under 35 U.S.C. 154(b) by 414 days.

(21) Appl. No.: 17/641,074

(22) PCT Filed: Sep. 3, 2020

(86) PCT No.: PCT/EP2020/074574
§ 371 (c)(1),
(2) Date: Mar. 7, 2022

(87) PCT Pub. No.: WO2021/047986
PCT Pub. Date: Mar. 18, 2021

(65) Prior Publication Data
US 2022/0337064 A1  Oct. 20, 2022

(30) Foreign Application Priority Data

Sep. 9, 2019  (EP) ..................................... 19196284

(51) Int. Cl.
*H02M 7/48* (2007.01)
*G01R 19/00* (2006.01)
(Continued)

(52) U.S. Cl.
CPC ............ *H02J 1/02* (2013.01); *G01R 19/0092* (2013.01); *H02J 3/36* (2013.01); *H02M 1/0009* (2021.05);
(Continued)

(58) Field of Classification Search
CPC .......... H02J 1/02; H02J 3/36; H02J 2003/365; H02M 1/0009; H02M 7/4835; G01R 19/0092
See application file for complete search history.

(56) References Cited

U.S. PATENT DOCUMENTS

2012/0063179 A1* 3/2012 Gong ...................... H02M 1/12
363/40
2018/0062514 A1* 3/2018 Dong .................... H02M 3/158
2019/0386578 A1* 12/2019 Kajiyama ............ H02H 7/1216

FOREIGN PATENT DOCUMENTS

EP  19196284.4  9/2019
WO  2021047986 A1  3/2021

OTHER PUBLICATIONS

Asim Ibrahim: "Practical Aspects of Online Grid Impedance D1 Estimation for HVDC Applications", Master Thesis, Chalmers University of Technology, Dec. 31, 2018 (Year: 2018).*

(Continued)

Primary Examiner — Kyle J Moody
Assistant Examiner — Jye-June Lee
(74) Attorney, Agent, or Firm — Eversheds-Sutherland (US) LLP (57) ABSTRACT

An electrical assembly including a converter for connection to an electrical network, the converter including at least one module having at least one switching element and at least one energy storage device, the switching element and the energy storage device arranged to be combinable to provide a voltage source, the electrical assembly including a controller configured to control the switching of the switching
(Continued)

element, wherein the electrical assembly includes a sensor configured for measuring a current of the electrical network, wherein the controller and sensor are configured to carry out a characterization of an electrical parameter so that, in use the controller controls the switching of the switching element to modify an electrical parameter of the converter so as to modify the current of the electrical network, the sensor measures a resultant modified current, and the controller processes the measured resultant modified current to characterize the electrical parameter.

10 Claims, 6 Drawing Sheets

(51) Int. Cl.
    *H02J 1/02*     (2006.01)
    *H02J 3/36*     (2006.01)
    *H02M 1/00*     (2006.01)
    *H02M 7/483*     (2007.01)

(52) U.S. Cl.
    CPC ..... *H02M 7/4835* (2021.05); *H02J 2003/365* (2013.01)

(56) References Cited

OTHER PUBLICATIONS

European Search Report and Opinion issued in PCT/EP2020/074574, dated Jul. 10, 2020, 4 pages.

\* cited by examiner

$v_p^{(n)}$ is swept over $n$

ELECTRICAL ASSEMBLY HAVING A
CHARACTERIZED ELECTRICAL
PARAMETER

CROSS-REFERENCE TO RELATED
APPLICATIONS

This application is a U.S. National Stage Application under 35 U.S.C. 371 and claims the priority benefit of International Application No. PCT/EP2020/074574, filed Sep. 3, 2020, which claims priority to European Application No. 19196284.4, filed Sep. 9, 2019, both of which are incorporated herein by reference.

This invention relates to electrical assemblies comprising a converter for connection to an electrical network, preferably an AC power grid, and methods of operating an electrical assembly. This invention is preferably for use in high voltage direct current (HVDC) transmission.

In HVDC power transmission networks alternating current (AC) power is typically converted to direct current (DC) power for transmission via overhead lines, under-sea cables and/or underground cables. This conversion removes the need to compensate for the AC capacitive load effects imposed by the power transmission medium, i.e. the transmission line or cable, and reduces the cost per kilometre of the lines and/or cables, and thus becomes cost-effective when power needs to be transmitted over a long distance.

The conversion between DC power and AC power is utilized in power transmission networks where it is necessary to interconnect the DC and AC networks. In any such power transmission network, converters are required at each interface between AC and DC power to effect the required conversion from AC to DC or from DC to AC.

According to a first aspect of the invention, there is provided an electrical assembly comprising a converter for connection to an electrical network, the converter comprising at least one module including at least one switching element and at least one energy storage device, the or each switching element and the or each energy storage device in the or each module arranged to be combinable to selectively provide a voltage source, the electrical assembly including a controller configured to selectively control the switching of the or each switching element in the or each module, wherein the electrical assembly includes a sensor configured for measuring a current of the electrical network, wherein the controller and sensor are configured to operate in coordination to carry out a characterisation of an electrical parameter of the electrical network so that, in use:

the controller selectively controls the switching of the or each switching element in the or each module to modify an electrical parameter of the converter so as to modify the current of the electrical network;

the sensor measures a resultant modified current of the electrical network; and the controller processes the measured resultant modified current of the electrical network so as to characterise the electrical parameter of the electrical network.

The configuration of the controller and sensor in the electrical assembly of the invention results in an intelligent system that uses integrated converter hardware in the form of the or each module to characterise one or more electrical parameters of the connected electrical network. This provides the converter with an embedded electrical network characterisation capability and thereby obviates the need to utilise separate and dedicated electrical network characterisation equipment, such as an impedance analyser.

In addition, the use of the or each module in the characterisation process provides the converter with the ability to carry out online characterisation of the electrical network without the converter and electrical network having to go offline and without having to change the steady-state operating conditions of the converter and electrical network (such as active power and reactive power operating points).

Moreover, the use of the or each module in the characterisation process is further advantageous not only because the characterisation process is readily scalable to be compatible for use with converters of different ratings having different numbers of modules, but also because the number of modules used in the characterisation process can be readily varied to alter parameters of the characterisation process without having to incur significant cost in redesigning and building a new converter structure.

In contrast, using separate and dedicated electrical network characterisation equipment to characterise an electrical parameter of the connected electrical network incurs additional costs in the form of installation and operating costs, adds to the overall size and weight of the converter and electrical network, and is not as easily scalable for use with converters of different ratings and for different characterisation processes.

One or more electrical parameters of the electrical network, such as electrical network impedance, may change as a result of a change in operating condition(s) of the electrical network. Any change in operating condition(s) of the electrical network may arise due to, for example, a black start, varying power generation equipment due to selective connection and disconnection, varying loads, and energisation sequences for electrical network equipment or components such as transformers, cables and switchgear. The change of one or more electrical parameters of the electrical network may lead to an undesirable state of the converter and electrical network, such as system instability, which in turn could lead to equipment damage and/or the converter and electrical network going offline by, for example, tripping.

After the electrical parameter of the electrical network is characterised, the characterised parameter may then be used by the controller so as to adapt control of the converter. Thus, the configuration of the electrical assembly of the invention to carry out the characterisation process enables the converter to make real-time adjustments to its operation and/or structure in response to any change in electrical parameter of the electrical network, which is beneficial under constantly varying operating conditions of the electrical network.

In embodiments of the invention, the controller may be configured to process the characterised electrical parameter of the electrical network to control the switching of the or each switching element in the or each module so as to adapt control of the converter. As a result, the or each module of the converter is configured to carry out both the characterisation process and the subsequent responsive adjustment(s) to the control of the converter, thereby providing cost, size and weight benefits over using separate equipment for carrying out the respective processes.

Preferably the controller is configured to process the characterised electrical parameter of the electrical network to control the switching of the or each switching element in the or each module so as to adapt control of the converter by carrying out at least one of:

modifying an equivalent electrical impedance of the converter. For example, the or each module may be operated to vary their output voltage waveform in order to modify the equivalent electrical impedance of the converter;

modifying a control parameter of the converter;

providing or increasing active damping of one or more oscillations in the electrical network; and providing active filtering.

Such adaptation of the control of the converter has the beneficial effects of increasing a stability of the converter while it is connected to the electrical network and increasing a performance of the converter towards meeting one or more performance criteria;

In a preferred embodiment of the invention, the electrical network is an AC power grid. The invention provides a reliable means of carrying out online characterisation of a parameter of the AC power grid, particularly an electrical impedance of the AC power grid.

In further embodiments of the invention, the controller may be configured to process the measured resultant modified current of the electrical network so as to characterise an electrical impedance of the electrical network. The characterised electrical impedance provides an indication of the operating conditions of the electrical network.

In still further embodiments of the invention, the controller may be configured to process the measured resultant modified current of the electrical network so as to characterise an equivalent operating voltage of the electrical network. The characterised equivalent operating voltage also provides an indication of the operating conditions of the electrical network.

Modification of the electrical parameter of the converter to modify the current of the electrical network during the characterisation process may be carried out in a number of different ways.

Optionally the controller may be configured to selectively control the switching of the or each switching element in the or each module to provide a variable electrical impedance, preferably in combination with an inductor, to modify an equivalent electrical impedance of the converter so as to modify the current of the electrical network. The equivalent electrical impedance of the converter can then be used to help characterise the electrical parameter, such as electrical impedance and equivalent operating voltage, of the electrical network.

Further optionally the controller may be configured to selectively control the switching of the or each switching element in the or each module to inject the perturbation voltage so as to modify the current of the electrical network, such as injecting at least one current component into the current of the electrical network. Preferably the perturbation voltage may be a harmonic voltage and the or each injected current component may be a harmonic current component.

In this way the or each module may effectively operate as a controlled perturbation voltage source to enable injection of the or each current component into the current of the electrical network. The or each injected current component can then be used to help characterise the electrical parameter, such as electrical impedance, of the electrical network. In particular, the impact of the perturbation voltage on the steady-state operating conditions of the converter and electrical network can be minimised by setting the perturbation voltage level to be relatively negligible in comparison to the operating voltage levels of the converter and electrical network and/or by injecting the perturbation voltage irregularly or intermittently.

In embodiments of the invention, the controller and sensor may be configured to operate in coordination to carry out the characterisation of the electrical parameter of the electrical network over a range of frequencies.

This enables the electrical assembly of the invention to carry out a comprehensive online frequency characterisation of the electrical parameter of the electrical network.

In further embodiments of the invention, the converter may include at least one first module and at least one second module, wherein the controller may be configured to selectively control the switching of the or each switching element in the or each first module to carry out the characterisation of the electrical parameter of the electrical network, and wherein the controller may be configured to selectively control the switching of the or each switching element in the or each second module to carry out a normal operating mode of the converter.

The provision of the first and second modules in the electrical assembly of the invention enables each of the first and second modules to be optimised to carry out their respective functions. That is to say, the or each first module may be optimised to carry out the characterisation process and at the same time the or each second module may be optimised to carry out the normal operating mode of the converter, thus improving the efficiency and reliability of the converter.

Examples of normal operating modes of the converter include, but are not limited to, power conversion, power transfer and protection functions for the converter and/or electrical network.

In addition, the or each first module may be further configured to provide one or more additional functions such as active power damping and filtering with increased dynamic bandwidth, electrical fault management, module redundancy, and electrical impedance emulation in steady-state operating conditions, without interfering with the normal operating mode of the converter carried out by the or each second module.

According to a second aspect of the invention, there is provided an electrical assembly comprising a converter for connection to an electrical network, the converter comprising at least one first module and at least one second module, each of the first and second modules including at least one switching element and at least one energy storage device, the or each switching element and the or each energy storage device in the or each module arranged to be combinable to selectively provide a voltage source, the electrical assembly including a controller configured to selectively control the switching of the or each switching element in the or each module, wherein the controller is configured to selectively control the switching of the or each switching element in the or each second module to carry out a normal operating mode of the converter, wherein the controller is configured to, in response to receiving a characterised electrical parameter of the electrical network, process the characterised electrical parameter of the electrical network to control the switching of the or each switching element in the or each first module so as to adapt control of the converter.

Technical benefits of the features of the electrical assembly of the second aspect of the invention are as stated above with reference to the corresponding features of the electrical assembly of the first aspect of the invention.

Optionally the controller of the second aspect of the invention may be configured to, in response to receiving a characterised electrical parameter of the electrical network, process the characterised electrical parameter of the electrical network to control the switching of the or each switching element in the or each first module so as to adapt control of the converter by carrying out at least one of:

modifying an equivalent electrical impedance of the converter;

modifying a control parameter of the converter;

providing or increasing active damping of one or more oscillations in the electrical network;

providing active filtering.

In embodiments of the invention employing the use of the first and second modules, the or each first module may be configured to be bypassable during a normal operating mode of the converter. This improves the efficiency of the normal operating mode of the converter by reducing conduction losses associated with the or each first module.

In further embodiments of the invention employing the use of the first and second modules, the or each switching element of the or each first module may have a higher switching frequency capability than the or each switching element of the or each second module.

In a preferred embodiment of the invention employing the use of the first and second modules, the or each switching element of the or each first module may be a wide-bandgap material based switching element and/or the or each switching element of the or each second module may be a silicon semiconductor based switching element. Examples of other wide-bandgap materials include, but are not limited to, silicon carbide, boron nitride, gallium nitride and aluminium nitride. Configuring the switching elements of the first and second modules as such permits the invention to benefit from the desirable properties of wide-bandgap based switching elements and/or silicon semiconductor based switching elements.

The converter may be configured so that the or each first module is controlled in use to carry out one or more functions of the or each second module and/or the or each second module is controlled in use to carry out one or more functions of the or each first module. When the converter includes a plurality of first modules, the converter may be configured so that one, some or all of the first modules is controlled in use to carry out one or more functions of the or each second module. When the converter includes a plurality of second modules, the converter may be configured so that one, some or all of the second modules is controlled in use to carry out one or more functions of the or each first module.

Alternatively the converter may be configured so that the first and second modules are controlled in use to carry out their respective functions but the or each first module is not controlled to carry out any function of the or each second module and the or each second module is not controlled to carry out any function of the or each first module, That is to say, the first and second modules are controlled to carry out respective different roles within the converter operation.

In the invention, the plurality of first and second modules may be configured so that the second modules comprise 70% to 99%, 75% to 95%, 80% to 90% or 95% to 99% of the plurality of first and second modules while the or each first module comprises 1% to 30%, 5% to 25%, 10% to 20% or 1% to 4% of the plurality of first and second modules.

In the invention, the injected perturbation voltage may be 1%, 2%, 3%, 5% or 10%, or about 1%, 2%, 3%, 5% or 10%, of the output voltage of the converter. Accordingly the voltage rating of the or each first module can be set to be significantly lower than the voltage rating of the or each second module, thus providing further converter size, weight and cost savings.

According to a third aspect of the invention, there is provided a method of operating an electrical assembly to characterise an electrical parameter of an electrical network, the electrical assembly comprising a converter for connection to the electrical network, the converter comprising at least one module including at least one switching element and at least one energy storage device, the or each switching element and the or each energy storage device in the or each module arranged to be combinable to selectively provide a voltage source, wherein the method comprises the steps of:

controlling the switching of the or each switching element in the or each module to modify an electrical parameter of the converter so as to modify the current of the electrical network;

measuring a resultant modified current of the electrical network; and processing the measured resultant modified current of the electrical network so as to characterise the electrical parameter of the electrical network.

The features and advantages of the electrical assembly of the first aspect of the invention and its embodiments apply mutatis mutandis to the method of the third aspect of the invention and its embodiments.

The method of the third aspect of the invention may include the step of processing the characterised electrical parameter of the electrical network to control the switching of the or each switching element in the or each module so as to adapt control of the converter.

The method of the third aspect of the invention may include the step of processing the characterised electrical parameter of the electrical network to control the switching of the or each switching element in the or each module so as to adapt control of the converter by carrying out at least one of:

modifying an equivalent electrical impedance of the converter. For example, the or each module may be operated to vary their output voltage waveform in order to modify the equivalent electrical impedance of the converter;

modifying a control parameter of the converter;

providing or increasing active damping of one or more oscillations in the electrical network; and providing active filtering.

In the method of the third aspect of the invention, the electrical network may be an AC power grid.

The method of the third aspect of the invention may include the step of processing the measured resultant modified current of the electrical network so as to characterise an electrical impedance of the electrical network.

The method of the third aspect of the invention may include the step of processing the measured resultant modified current of the electrical network so as to characterise an equivalent operating voltage of the electrical network.

The method of the third aspect of the invention may include the step of controlling the switching of the or each switching element in the or each module to provide a variable electrical impedance to modify an equivalent electrical impedance of the converter so as to modify the current of the electrical network.

The method of the third aspect of the invention may include the step of controlling the switching of the or each switching element in the or each module to inject the perturbation voltage so as to modify the current of the electrical network, such as injecting at least one current component into the current of the electrical network. Preferably the perturbation voltage may be a harmonic voltage and the or each injected current component may be a harmonic current component.

The method of the third aspect of the invention may include the step of carrying out the characterisation of the electrical parameter of the electrical network over a range of frequencies.

In the method of the third aspect of the invention, the converter may include at least one first module and at least one second module. The method of the third aspect of the invention may include the steps of controlling the switching of the or each switching element in the or each first module to carry out the characterisation of the electrical parameter of the electrical network, and controlling the switching of the or each switching element in the or each second module to carry out a normal operating mode of the converter.

According to a fourth aspect of the invention, there is provided a method of operating an electrical assembly in accordance with a characterised parameter of an electrical network, the electrical assembly comprising a converter for connection to the electrical network, the converter comprising at least one first module and at least one second module, each of the first and second modules including at least one switching element and at least one energy storage device, the or each switching element and the or each energy storage device in the or each module arranged to be combinable to selectively provide a voltage source, the method comprising the steps of:
  controlling the switching of the or each switching element in the or each second module to carry out a normal operating mode of the converter;
  receiving a characterised electrical parameter of the electrical network; and
  in response to receiving the characterised electrical parameter of the electrical network, processing the characterised electrical parameter of the electrical network to control the switching of the or each switching element in the or each first module so as to adapt control of the converter.

The features and advantages of the electrical assembly of the second aspect of the invention and its embodiments apply mutatis mutandis to the method of the fourth aspect of the invention and its embodiments.

The method of the fourth aspect of the invention may include the step of:
  in response to receiving the characterised electrical parameter of the electrical network, processing the characterised electrical parameter of the electrical network to control the switching of the or each switching element in the or each first module so as to adapt control of the converter by carrying out at least one of:
  modifying an equivalent electrical impedance of the converter;
  modifying a control parameter of the converter;
  providing or increasing active damping of one or more oscillations in the electrical network;
  providing active filtering.

The method of the second or fourth aspect of the invention may include the step of bypassing the or each first module during a normal operating mode of the converter.

In the method of the second or fourth aspect of the invention employing the use of the first and second modules, the or each switching element of the or each first module may have a higher switching frequency capability than the or each switching element of the or each second module.

In the method of the second or fourth aspect of the invention, the or each switching element of the or each first module may be a wide-bandgap material based switching element and/or the or each switching element of the or each second module may be a silicon semiconductor based switching element. Examples of other wide-bandgap materials include, but are not limited to, silicon carbide, boron nitride, gallium nitride and aluminium nitride.

The method of the second or fourth aspect of the invention may include the step of controlling the or each first module to carry out one or more functions of the or each second module and/or may include the step of controlling the or each second module to carry out one or more functions of the or each first module. When the converter includes a plurality of first modules, the method of the second or fourth aspect of the invention may include the step of controlling one, some or all of the first modules to carry out one or more functions of the or each second module. When the converter includes a plurality of second modules, the method of the second or fourth aspect of the invention may include the step of controlling one, some or all of the second modules to carry out one or more functions of the or each first module.

Alternatively the method of the second or fourth aspect of the invention may include the step of controlling the first and second modules to carry out their respective functions, but the or each first module is not controlled to carry out any function of the or each second module and the or each second module is not controlled to carry out any function of the or each first module, The or each module may vary in configuration, non-limiting examples of which are set out as follows.

In a first exemplary configuration of a module, the or each switching element and the or each energy storage device in the module may be arranged to be combinable to selectively provide a unidirectional voltage source. For example, the module may include a pair of switching elements connected in parallel with an energy storage device in a half-bridge arrangement to define a 2-quadrant unipolar module that can provide zero or positive voltage and can conduct current in two directions.

In a second exemplary configuration of a module, the or each switching element and the or each energy storage device in the module may be arranged to be combinable to selectively provide a bidirectional voltage source. For example, the module may include two pairs of switching elements connected in parallel with an energy storage device in a full-bridge arrangement to define a 4-quadrant bipolar module that can provide negative, zero or positive voltage and can conduct current in two directions.

A plurality of modules may be connected in series to define a chain-link converter. The structure of the chain-link converter permits build-up of a combined voltage across the chain-link converter, which is higher than the voltage available from each of its individual modules, via the insertion of the energy storage devices of multiple modules, each providing its own voltage, into the chain-link converter. In this manner switching of the or each switching element in each module causes the chain-link converter to provide a stepped variable voltage source, which permits the generation of a voltage waveform across the chain-link converter using a step-wise approximation. As such the chain-link converter is capable of providing a wide range of complex voltage waveforms.

At least one switching element may include at least one self-commutated switching device. The or each self-commutated switching device may be an insulated gate bipolar transistor (IGBT), a gate turn-off thyristor (GTO), a field effect transistor (FET), metal-oxide-semiconductor field-effect transistor (MOSFET), an injection-enhanced gate transistor (IEGT), an integrated gate commutated thyristor (IGCT), bimode insulated gate transistor (BIGT) or any other self-commutated switching device. The number of switching devices in each switching element may vary depending on the required voltage and current ratings of that switching element.

At least one switching element may further include a passive current check element that is connected in anti-parallel with the or each switching device. The or each passive current check element may include at least one passive current check device. The or each passive current check device may be any device that is capable of limiting current flow in only one direction, e.g. a diode. The number of passive current check devices in each passive current check element may vary depending on the required voltage and current ratings of that passive current check element.

Each energy storage device may be any device that is capable of storing and releasing energy to selectively provide a voltage, e.g. a capacitor, fuel cell or battery.

The configuration of the converter may vary depending on the requirements of the power transfer between the first and second networks.

In embodiments of the invention, the converter may include at least one converter limb and a plurality of modules, the or each converter limb extending between a pair of first terminals defining first and second DC terminals, the or each converter limb including first and second limb portions separated by a second terminal defining an AC terminal, each limb portion including at least one of the modules.

In a preferred embodiment of the invention, the converter includes three converter limbs, each of which is connectable via the respective AC terminal to a respective phase of a three-phase AC network. It will be appreciated that the converter may include a different number of converter limbs, each of which is connectable via the respective AC terminal to a respective phase of an AC network with the corresponding number of phases.

It will be appreciated that the use of the terms "first" and "second", and the like, in this patent specification is merely intended to help distinguish between similar features (e.g. the first and second modules), and is not intended to indicate the relative importance of one feature over another feature, unless otherwise specified.

Within the scope of this application it is expressly intended that the various aspects, embodiments, examples and alternatives set out in the preceding paragraphs, and the claims and/or the following description and drawings, and in particular the individual features thereof, may be taken independently or in any combination. That is, all embodiments and all features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

A preferred embodiment of the invention will now be described, by way of a non-limiting example, with reference to the accompanying drawings in which.

The figures are not necessarily to scale, and certain features and certain views of the figures may be shown exaggerated in scale or in schematic form in the interests of clarity and conciseness.

The following embodiment of the invention is used primarily in HVDC applications, but it will be appreciated that the following embodiment of the invention is applicable mutatis mutandis to other applications operating at different voltage levels.

Figure 1:
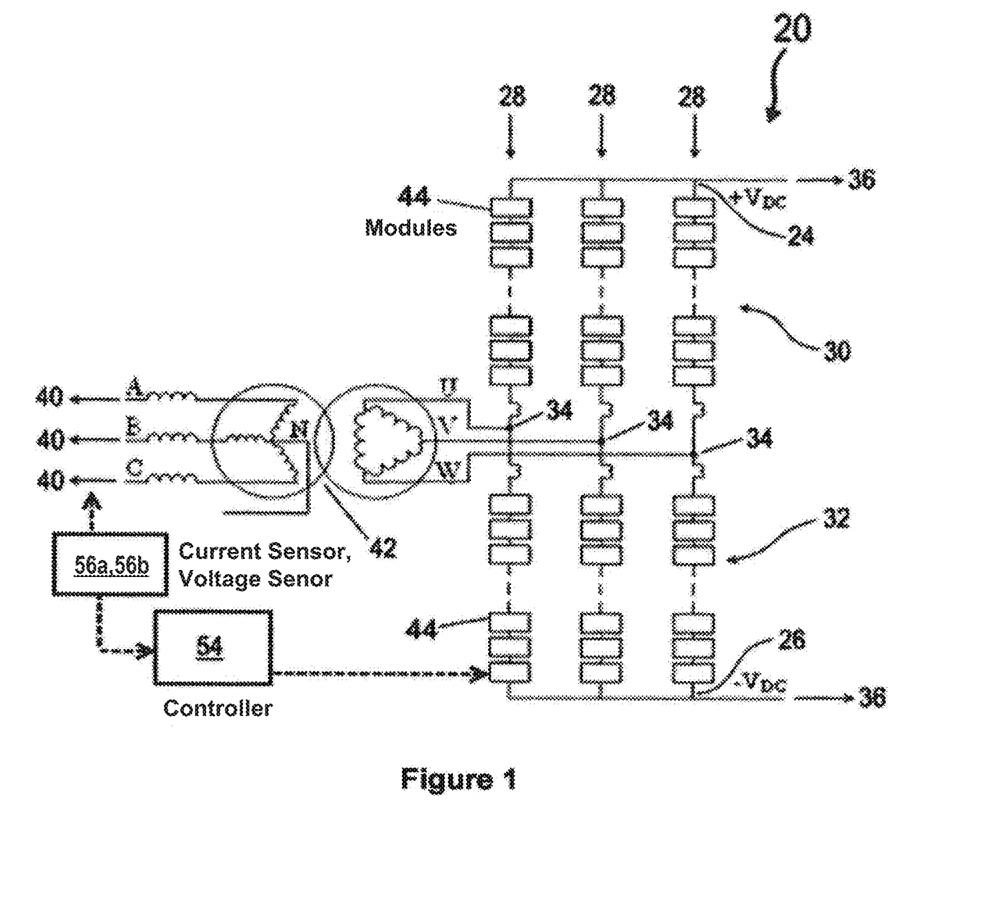
FIG. 1 shows an electrical assembly according to an embodiment of the invention.

An electrical assembly according to an embodiment of the invention is shown in FIG. 1 and is designated generally by the reference numeral 20.

The electrical assembly comprises a voltage source converter 20.

The voltage source converter 20 includes first and second DC terminals 24,26 and a plurality of converter limbs 28. Each converter limb 28 extends between the first and second DC terminals 24,26 and includes first and second limb portions 30,32 separated by a respective AC terminal 34. In each converter limb 28, the first limb portion 30 extends between the first DC terminal 24 and the AC terminal 34, while the second limb portion 32 extends between the second DC terminal 26 and the AC terminal 34.

In use, the first and second DC terminals 24,26 of the voltage source converter 20 are respectively connected to a DC network 36. In use, the AC terminal 34 of each converter limb 28 of the voltage source converter 20 is connected to a respective AC phase of a three-phase AC network 40 via a star-delta transformer arrangement 42. The three-phase AC network 40 is an AC power grid 40. It is envisaged that, in other embodiments of the invention, the transformer arrangement may be a different type of transformer arrangement, such as a star-star transformer arrangement.

Each limb portion 30,32 includes a switching valve, which includes a chain-link converter that is defined by a plurality of series-connected modules 44.

Each module 44 may vary in topology, examples of which are described as follows.

Figure 2A:
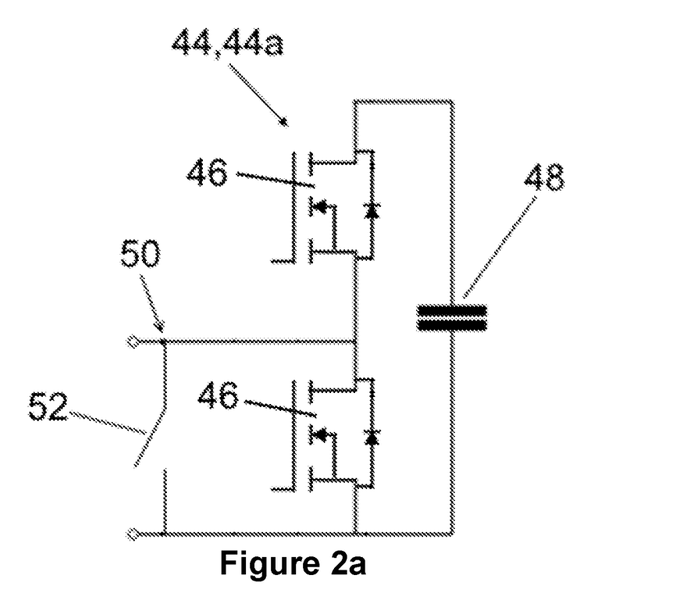
FIGS. 2*a* and 2*b* show exemplary half-bridge and full-bridge chain-link module configurations of a first module of the electrical assembly of FIG. 1.

FIG. 2*a* shows schematically the structure of an exemplary first module 44 in the form of a half-bridge module 44*a*. The half-bridge module 44*a* includes a pair of switching elements 46 and a capacitor 48. Each switching element 46 of the half-bridge module 44*a* is in the form of a silicon carbide (SiC) based MOSFET which is connected in parallel with an anti-parallel diode. The pair of switching elements 46 are connected in parallel with the capacitor 48 in a half-bridge arrangement to define a 2-quadrant unipolar module 44*a* that can provide zero or positive voltage and can conduct current in both directions.

Figure 2B:
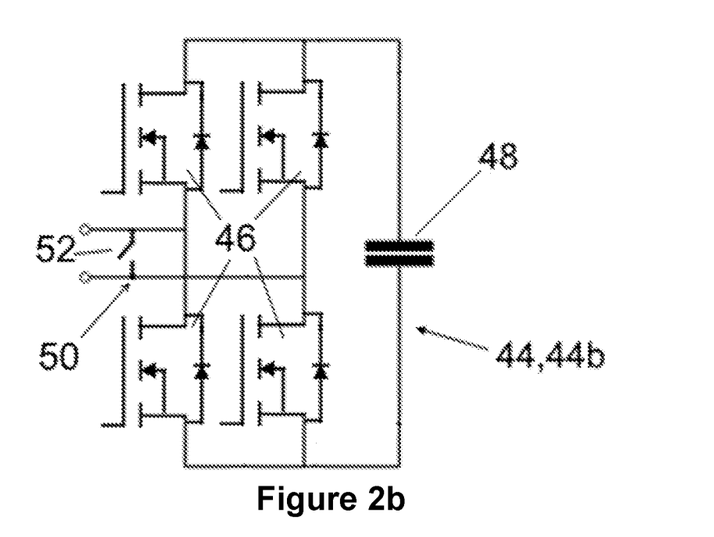

FIG. 2*b* shows schematically the structure of an exemplary first module 44 in the form of a full-bridge module 44b. The full-bridge module 44b includes two pairs of switching elements 46 and a capacitor 48. Each switching element 46 of the full-bridge module 44b is in the form of a SiC based MOSFET which is connected in parallel with an anti-parallel diode. The pairs of switching elements 46 are connected in parallel with the capacitor 48 in a full-bridge arrangement to define a 4-quadrant bipolar module 44b that can provide negative, zero or positive voltage and can conduct current in both directions.

Figure 3A:
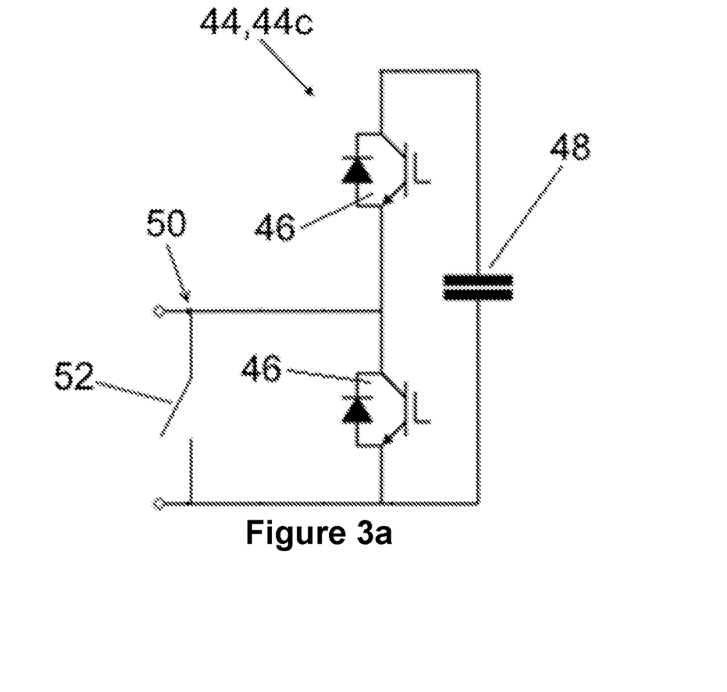
FIGS. 3*a* and 3*b* show exemplary half-bridge and full-bridge chain-link module configurations of a second module of the electrical assembly of FIG. 1.

FIG. 3a shows schematically the structure of an exemplary second module 44 in the form of a half-bridge module 44c. The half-bridge module 44c includes a pair of switching elements 46 and a capacitor 48. Each switching element 46 of the half-bridge module 44c is in the form of a silicon (Si) semiconductor based IGBT which is connected in parallel with an anti-parallel diode. The pair of switching elements 46 are connected in parallel with the capacitor 48 in a half-bridge arrangement to define a 2-quadrant unipolar module 44c that can provide zero or positive voltage and can conduct current in both directions.

Figure 3B:
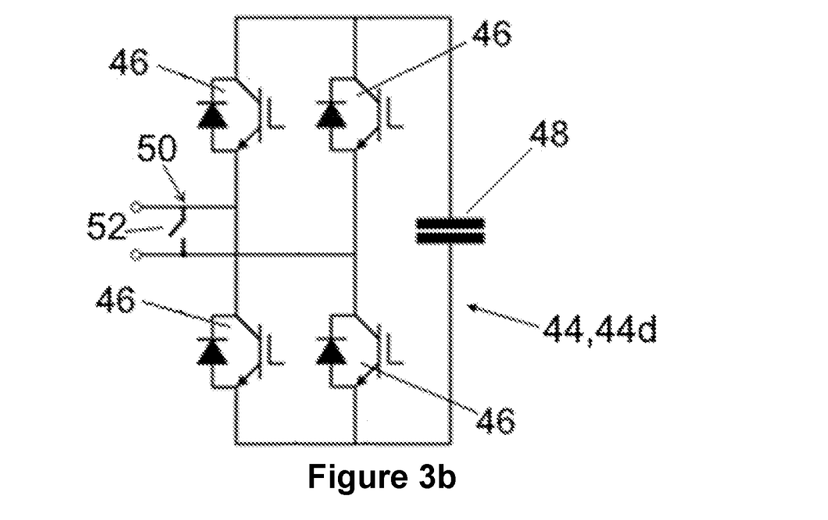

FIG. 3b shows schematically the structure of an exemplary second module 44 in the form of a full-bridge module 44d. The full-bridge module 44d includes two pairs of switching elements 46 and a capacitor 48. Each switching element 46 of the full-bridge module 44d is in the form of a Si semiconductor based IGBT which is connected in parallel with an anti-parallel diode. The pairs of switching elements 46 are connected in parallel with the capacitor 48 in a full-bridge arrangement to define a 4-quadrant bipolar module 44d that can provide negative, zero or positive voltage and can conduct current in both directions.

In each switching valve, the modules 44 comprise a plurality of first modules 44 and a plurality of second modules 44. Each switching valve is configured so that, in each switching valve, the second modules 44 comprise a large majority, e.g. 95% to 99%, of the plurality of modules 44 while the first modules comprise a small minority, e.g. 1% to 4%, of the plurality of modules 44. The structure of each first module 44 is identical to the structure of each second module 44, except that the switching elements 46 of each first module 44 are SiC based switching elements and the switching elements 46 of each second module 44 are Si semiconductor based switching elements.

The structure of a given module 44 includes the arrangement and type of switching elements 46 and energy storage device 48 used in the given module 44. It will be appreciated that it is not essential for the structure of each first module 44 to be identical to the structure of each second module 44. For example, the plurality of modules 44 may comprise a combination of half-bridge first modules 44a and full-bridge second modules 44d or a combination of full-bridge first modules 44b and half-bridge second modules 44c. In addition, it is not essential for all of the first modules 44 to have the same module structure, and it is not essential for all of the second modules 44 to have the same module structure.

It will be understood that the materials of the switching elements 46 may vary. Preferably each switching element 46 of each first module 44 has a higher switching frequency capability than each switching element 46 of each second module 44. For example, each SiC based MOSFET may be replaced by another wide-bandgap material based switching element. Examples of other wide-bandgap materials include, but are not limited to, boron nitride, gallium nitride and aluminium nitride.

It is envisaged that, in other embodiments of the invention, each switching element 46 of each module 44 may be replaced by a gate turn-off thyristor (GTO), another field effect transistor (FET), an injection-enhanced gate transistor (IEGT), an integrated gate commutated thyristor (IGCT), bimode insulated gate transistor (BIGT) or any other self-commutated semiconductor device. It is also envisaged that, in other embodiments of the invention, each diode may be replaced by a plurality of series-connected diodes.

The capacitor 48 of each module 44 is selectively bypassed or inserted into the corresponding chain-link converter by changing the states of the switching elements 46. This selectively directs current through the capacitor 48 or causes current to bypass the capacitor 48, so that the module 44 provides a zero or positive voltage.

The capacitor 48 of the module 44 is bypassed when the switching elements 46 in the module 44 are configured to form a short circuit in the module 44, whereby the short circuit bypasses the capacitor 48. This causes current in the corresponding chain-link converter to pass through the short circuit and bypass the capacitor 48, and so the module 44 provides a zero voltage, i.e. the module 44 is configured in a bypassed mode.

The capacitor 48 of the module 44 is inserted into the corresponding chain-link converter when the switching elements 46 in the module 44 are configured to allow the current in the corresponding chain-link converter to flow into and out of the capacitor 48. The capacitor 48 then charges or discharges its stored energy so as to provide a positive voltage, i.e. the module 44 is configured in a non-bypassed mode.

In this manner the switching elements 46 in each module 44 are switchable to control flow of current through the corresponding capacitor 48.

It is possible to build up a combined voltage across each chain-link converter, which is higher than the voltage available from each of its individual modules 44, via the insertion of the capacitors of multiple modules 44, each providing its own voltage, into each chain-link converter. In this manner switching of the switching elements 46 in each module 44 causes each chain-link converter to provide a stepped variable voltage source, which permits the generation of a voltage waveform across each chain-link converter using a step-wise approximation. Hence, the switching elements 46 in each limb portion 30,32 are switchable to selectively permit and inhibit flow of current through the corresponding capacitor 48 in order to control a voltage across the corresponding limb portion 30,32.

It is envisaged that, in other embodiments of the invention, each module 44 may be replaced by another type of module which includes a plurality of switching elements and at least one energy storage device, the plurality of switching elements and the or each energy storage device in each such module arranged to be combinable to selectively provide a voltage source.

It is also envisaged that, in other embodiments of the invention, the capacitor 48 in each module 44 may be replaced by another type of energy storage device which is capable of storing and releasing energy to provide a voltage, e.g. a battery or a fuel cell.

Each switching valve includes a plurality of bypass devices 50. Each bypass device 50 is connected in parallel with a respective one of the modules 44. More specifically, each bypass device 50 includes a bypass switching element 52 connected across the terminals of the corresponding module 44. Each bypass switching element 52 may be in the form of a semiconductor switching element that comprises one or more semiconductor switching devices.

The electrical assembly further includes a controller 54 programmed to control the switching of the switching elements 46 and the bypass devices 50.

For the purposes of simplicity, the controller 54 is exemplarily described with reference to its implementation as a single control unit. In other embodiments, the controller 54 may be implemented as a plurality of control units. The configuration of the controller 54 may vary depending on specific requirements of the voltage source converter 20. For example, the controller 54 may include a plurality of control units, each of which is programmed to control the switching of the switching elements 46 of a respective one of the modules 44 and the corresponding bypass device 50. Each control unit may be configured to be internal to, or external of, the corresponding module 44. Alternatively, the controller may include a combination of one or more control units internal to the corresponding module 44 and one or more control units external of the corresponding module 44. Each control unit may be configured to communicate with at least one other control unit via telecommunications links.

The electrical assembly further comprises a current sensor 56a that is configured to measure an alternating current $i_{ac}$ of the AC network 40, and a voltage sensor 56b that is configured to measure a voltage $v_{pcc}$ at the point of common coupling (pcc). Each sensor 56a,56b may be configured to communicate with the controller 54 via telecommunications links.

The controller 54 and the sensors 56a,56b may be separate from or form part of the voltage source converter 20.

Operation of the electrical assembly is described as follows with reference to FIGS. 4 to 8.

In order to transfer power between the DC and AC networks 36,40, the controller 54 controls the switching of the switching elements 46 of the second modules 44 to switch the capacitors of the respective limb portions 30,32 into and out of circuit between the respective DC and AC terminals 24,26,34 to interconnect the DC and AC networks 36,40. The controller 54 switches the switching elements 46 of the second modules 44 of each limb portion 30,32 to provide a stepped variable voltage source between the respective DC and AC terminals 24,26,34 and thereby generate a voltage waveform so as to control the configuration of an AC voltage waveform at the corresponding AC terminal 34 to facilitate the transfer of power between the DC and AC networks 36,40.

Preferably the power transfer function is carried out using only the second modules 44 while the first modules 44 are bypassed by configuring their bypass devices 50 in order to improve the efficiency of the power transfer. Furthermore, the second modules 44 may be operated to carry out protection functions for the voltage source converter 20 and the DC and AC networks 36,40.

The first modules 44 provide the voltage source converter 20 with module redundancy in that the first modules 44 may be operated to carry out the power transfer function and protection functions in certain situations, such as one or more second modules 44 going offline and operating circumstances requiring a higher number of modules 44 than can be provided by the second modules 44.

The electrical impedance $Z_g$ of the AC network 40 may vary with time as a result of changes in its operating conditions that may arise as a result of a black start, varying power generation equipment due to selective connection and disconnection, varying loads, and energisation sequences for electrical network equipment or components such as transformers, cables and switchgear. Dynamics of the AC network 40 can be difficult to control in a reliable manner. This is in part because variation in the electrical impedance $Z_g$ of the AC network 40 can be volatile due to increasing penetration of renewable energy systems and can be unpredictable due to increasing numbers of distributed power sources and loads. Such variation in the electrical impedance $Z_g$ of the AC network 40 creates the risk of system instability that in turn could lead to undesirable power oscillations, equipment damage and/or the voltage source converter 20 and the AC network 40 tripping to an offline state.

To reduce the risk of system instability, the controller 54 controls the switching of the switching elements 46 of the first modules 44 to carry out a characterisation process in coordination with the sensors 56a,56b.

A first non-limiting example of the characterisation process is described as follows.

Figure 4:
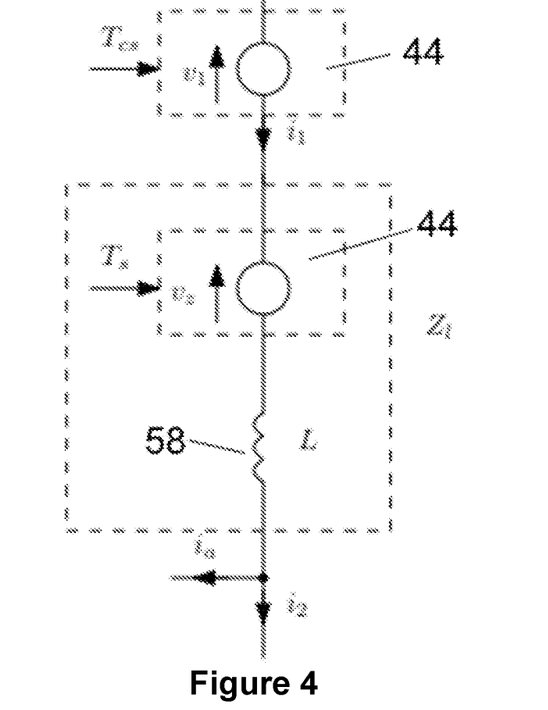
FIG. 4 shows an operation of a chain-link module to provide a variable electrical impedance.

The controller 54 controls the switching of at least one selected first module 44 to vary its output voltage waveform so that the or each selected first module 44 in combination with an inductor 58 in the same limb portion 30,32 provides a variable electrical impedance $Z_L$. The SiC based MOSFETs of the or each selected first module 44 are switched at higher frequencies than the Si semiconductor based IGBTs of the second modules 44. FIG. 4 shows the operation of a first module 44 in combination with an inductor 58 to provide the variable electrical impedance $Z_L$. This in turn has the effect of modifying the equivalent electrical impedance $Z_C$ of the voltage source converter 20 to be variable. The equivalent electrical impedance $Z_C$ of the voltage source converter 20 is given by the following equation:

$$Z_c = (1/2)Z_L + j\omega L_t$$

where $\omega$ is the angular frequency and $L_t$ is the transformer inductance.

As a result of modifying the equivalent electrical impedance $Z_C$ of the voltage source converter 20, the alternating current $i_{ac}$ of the AC network 40 is modified.

Figure 5:
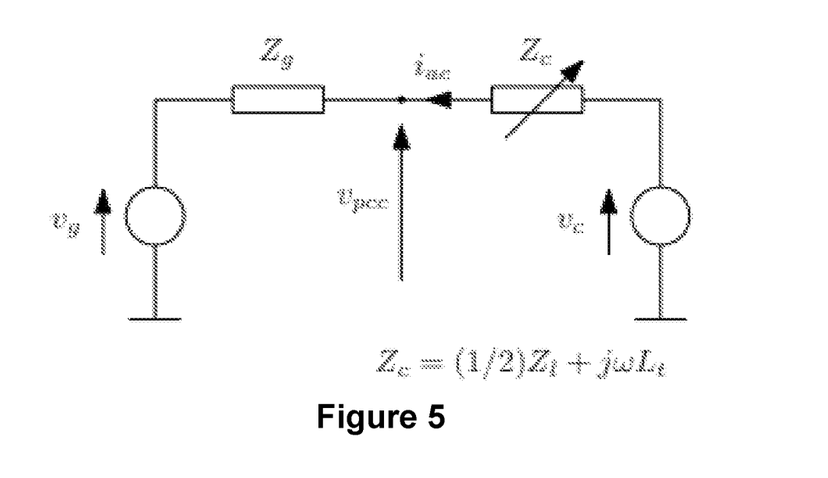
FIG. 5 shows an equivalent circuit of a voltage source converter and an AC network when a chain-link module is operated to provide a variable electrical impedance.

FIG. 5 shows an equivalent circuit of the voltage source converter 20 and the AC network 40 when one or more selected first modules 44 are operated as a variable electrical impedance so as to modify the equivalent electrical impedance $Z_C$ of the voltage source converter 20.

By varying the equivalent electrical impedance $Z_C$ of the voltage source converter 20, an estimation of the electrical impedance $Z_g$ and the equivalent operating voltage $v_g$ of the AC network 40 can be performed by using the Kirchhoff equations as follows:

$$v_{pcc}(1) = v_g + i_{ac}(1) \times Z_g$$

$$v_{pcc}(2) = v_g + i_{ac}(2) \times Z_g$$

$$v_{pcc}(n) = v_g + i_{ac}(n) \times Z_g$$

where $v_{pcc}(k)$ is the voltage at the point of common coupling measured by the voltage sensor 56b at the instant of time k, and $i_{ac}(k)$ is the measured alternating current of the AC network 40 measured by the current sensor 56a at the instant of time k.

The controller processes the measured voltages $v_{pcc}(k)$ and the measured currents $i_{ac}(k)$ by applying a least squares algorithm, such as a recursive least squares algorithm, to the above equations in order to obtain estimated values for the electrical impedance $Z_g$ and the equivalent operating voltage $v_g$ of the AC network 40. It will be appreciated that there are other methods for solving the above equations in order to obtain estimated values for the electrical impedance $Z_g$ and the equivalent operating voltage $v_g$ of the AC network 40.

Variation of the equivalent electrical impedance $Z_C$ of the voltage source converter 20 therefore enables the estimation of the electrical impedance $Z_g$ and the equivalent operating voltage $v_g$ of the AC network 40, which can be done without demanding new active power (P) and reactive power (Q) operating points.

A second non-limiting example of the characterisation process is described as follows.

Figure 6:
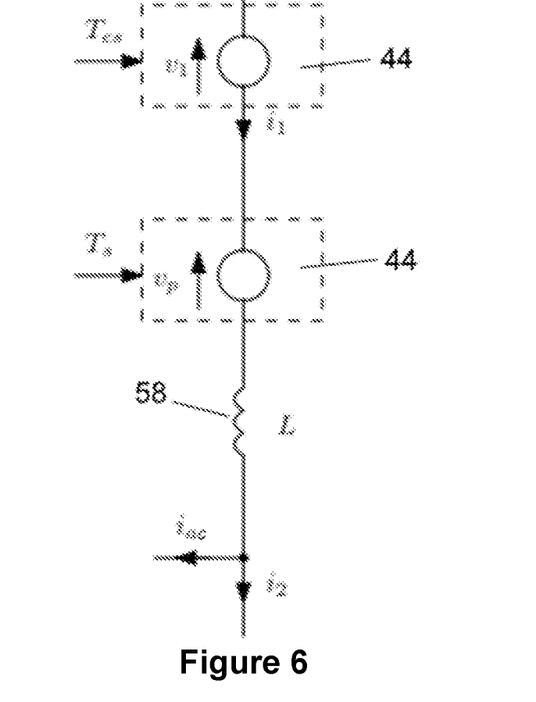
FIG. 6 shows an operation of a chain-link module as a controlled perturbation voltage source.

The controller 54 controls the switching of at least one selected first module 44 to vary its output voltage waveform so that the or each selected first module 44 acts as a variable voltage source to inject a perturbation harmonic voltage $v_p$ at the point of common coupling over a range of different frequencies that are multiples of an angular frequency $\omega_0$. The SiC based MOSFETs of the or each selected first module 44 are switched at higher frequencies than the Si semiconductor based IGBTs of the second modules 44. FIG. 6 shows the operation of a first module 44 as a controlled perturbation voltage source. The injection of the perturbation harmonic voltage $v_p$ in turn results in injection of a harmonic current component into the alternating current $i_{ac}$ of the AC network 40. Since the electrical impedance $Z_c(n)$ of the voltage source converter 20 at a given frequency $\omega(n)$ at the instant of time k is known, the alternating current $i_{ac}(n)$ of the AC network 40 at the instant of time k is given by:

$$i_{ac}(n)=v_p(n)/(Z_g(n)+Z_c(n))$$

The sensor 56 measures the alternating current $i_{ac}$ of the AC network 40 at a given frequency $\omega(n)$ and provides the measured alternating current $i_{ac}$ to the controller 54, which then estimates the electrical impedance $Z_g(n)$ of the AC network 40 at the given frequency $\omega(n)$ using the above equation.

If the voltage $v_g$ of the AC network 40 contains one or more harmonics, then the one or more harmonics can be measured from the alternating current $i_{ac}(n)$ when $v_p(n)$ is equal to zero using the superposition principle and subtracted from the above equation to estimate the electrical impedance $Z_g(n)$ of the AC network 40 at different frequencies.

Figure 7:
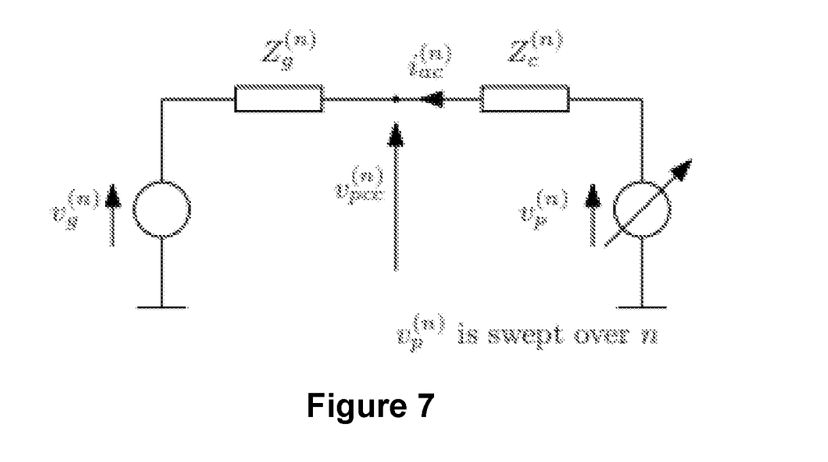
FIG. 7 shows an equivalent circuit of a voltage source converter and an AC network when a chain-link module is operated as a controlled perturbation voltage source over a range of frequencies.

An online frequency sweep can be performed over a range of frequencies that are multiples of the angular frequency wo in order to characterise the AC network electrical impedance $Z_g$ at each frequency. FIG. 7 shows an equivalent circuit of the voltage source converter 20 and the AC network 40 when one or more selected first modules 44 are operated as a controlled perturbation voltage source to inject the perturbation harmonic voltage over a range of frequencies so as to inject a harmonic current component into the alternating current $i_{ac}$ of the AC network 40.

The voltage source converter 20 therefore can be used as an online integrated impedance analyser to estimate the electrical impedance $Z_g$ of the AC network 40.

In the characterisation process, the injected perturbation voltage may be 1%, or about 1%, of the output voltage of the voltage source converter 20.

After the characterisation process is completed, the controller 54 uses the characterised electrical impedance $Z_g$ to estimate the stability of the system defined by the voltage source converter 20 and the AC network 40 as given by the ratio $Z_c/Z_g$. If the system is estimated to be at risk of being unstable i.e. the ratio $Z_c/Z_g$ is approaching a value of −1, the controller 54 controls the switching of the switching elements of one or more of the first modules 44 to vary its output voltage waveform, or their output voltage waveforms, so as to modify an electrical impedance $Z_c$ of the voltage source converter 20 to control the ratio $Z_c/Z_g$ and thereby increase a stability of the system. The Nyquist stability criterion, which explores the range of frequencies at which $Z_c/Z_g=-1$, can be used to help determine and configure the stability of the system.

As a result, the configuration of the electrical assembly to carry out the characterisation process enables the voltage source converter 20 to make real-time adjustments to its electrical impedance $Z_c$ in response to any change in electrical impedance $Z_g$ of the AC network 40. This not only enhances the control performance of the voltage source converter 20 under varying operating conditions of the AC network 40 but also can be used to provide an increased stability margin under weak AC power grids and time-varying parameters.

Furthermore, after the characterisation process is completed, the control of the voltage source converter 20 can be adapted in various ways to enhance its performance and/or enhance system stability.

Figure 8:
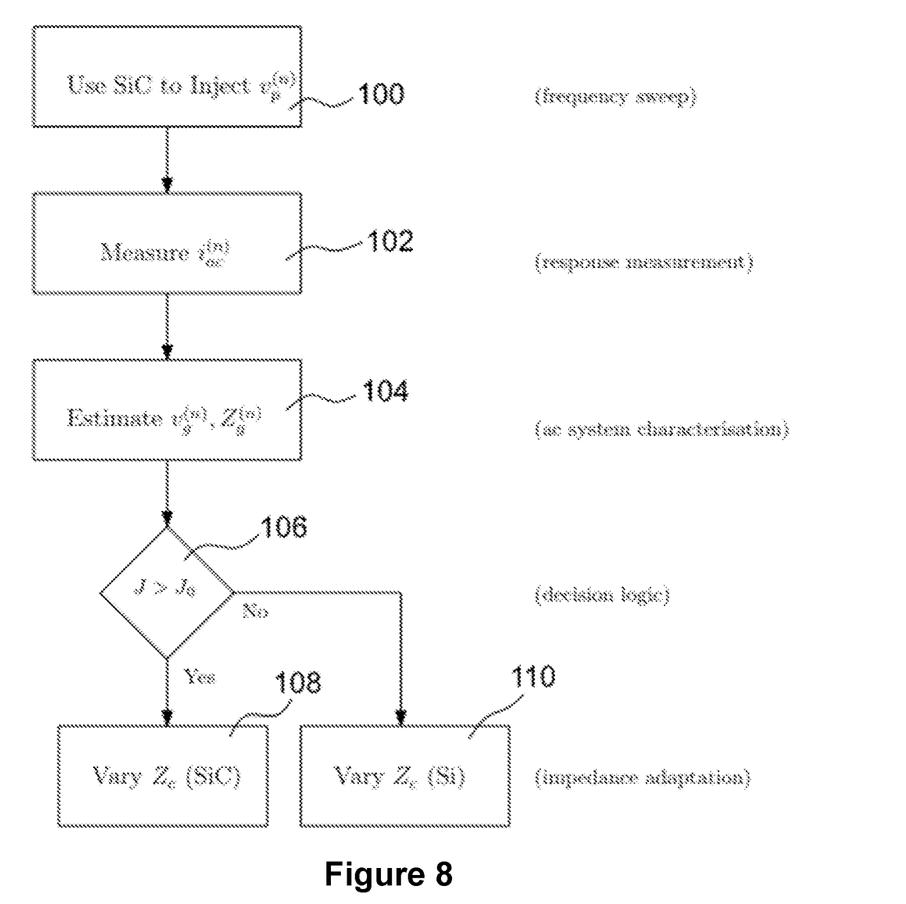
FIG. 8 shows a flow chart of the characterisation process carried out by the electrical assembly of FIG. 1.

The characterisation process and subsequent responsive adaptation of the control of the voltage source converter 20 are summarised as a series of steps in the flowchart of FIG. 8 with reference to the second example of the characterisation process. It will be appreciated that the flowchart of FIG. 8 applies mutatis mutandis to the first example of the characterisation process.

In a first step 100, one or more first modules 44 are operated to inject the perturbation voltage $v_p$. This is followed by a second step 102 of measuring the modified alternating current $i_{ac}$ of the AC network 40, which is a consequence of the injection of the perturbation voltage $v_p$.

In a third step 104, the electrical impedance $Z_g$ and the equivalent operating voltage $v_g$ of the AC network 40 are estimated, for example, using a recursive least-squares algorithm.

The fourth step 106 involves a decision process based on a cost function J. The cost function J is defined based on a weighting combination of several variables associated with the voltage source converter 20 such as the switching frequency of the SiC based MOSFETs of the first modules 44, the switching frequency of the Si semiconductor based IGBTs of the second modules 44, conduction losses, the number of modules that are switched into circuit in the voltage source converter 20, module voltage ripple, module energy levels and so on. In general, the cost function J will be non-linear. A decision threshold value $J_0$ is defined.

As mentioned above, after the characterisation process is completed, the controller 54 uses the characterised electrical impedance $Z_g$ to estimate the stability of the system defined by the voltage source converter 20 and the AC network 40 as given by the ratio $Z_c/Z_g$. If it is necessary to then modify the electrical impedance $Z_c$ of the voltage source converter 20, then the electrical impedance $Z_c$ of the voltage source converter 20 can be varied to achieve one or more purposes such as system stability, meeting performance criteria, oscillation damping and so on.

Either or both of the first and second modules 44 may be controlled by the controller 54 to vary their output voltage waveforms in order to modify the electrical impedance $Z_c$ of the voltage source converter 20. If the value of the cost function J exceeds the decision threshold value $J_0$, then the voltage source converter impedance $Z_c$ is modified in a fifth step 108 using the first modules 44 in order to benefit the voltage source converter's overall performance as defined by the cost function J. However, if the value of the cost function J is equal to or lower than the decision threshold value $J_0$, then the voltage source converter impedance $Z_c$ is modified in a sixth step 110 using the second modules 44.

In addition, after the characterisation process is completed, the controller 54 may process the characterised electrical impedance $Z_g$ of the AC network 40 to control either or both of the first and second modules 44 so as to adapt control of the voltage source converter 20 by carrying out at least one of:

modifying a control parameter of the voltage source converter 20;

providing or increasing active damping of one or more oscillations in the AC network 40; and providing active filtering.

The voltage source converter 20 of FIG. 1 therefore combines the first modules 44 based on SiC based switching elements 46 and the second modules 44 based on Si semiconductor based switching elements 46 in a hybrid topology to provide the functionality of online integrated frequency characterisation of the AC network 40 performed by the first modules 44 with faster switching capabilities alongside the normal operating mode of the voltage source converter 20 performed by the second modules 44. The configuration of the electrical assembly of FIG. 1 therefore obviates the need to utilise a separate and dedicated impedance analyser that incurs additional installation and operating costs, adds to the overall size and weight of the electrical assembly, and is not as easily scalable for use with voltage source converters of different ratings and for different characterisation processes.

In addition, the use of the first modules 44 in the characterisation process provides the electrical assembly with the ability to carry out online frequency characterisation of the AC network 40 without the voltage source converter 20 and the AC network 40 having to go offline and without having to change the steady-state operating conditions of the voltage source converter 20 and the AC network 40.

Moreover, the use of the first modules 44 in the characterisation process advantageously permits scaling of the characterisation process to be compatible for use with converters of different ratings having different numbers of modules, and also permits variation in the number of modules used in the characterisation process to alter parameters of the characterisation process without having to incur significant cost in redesigning and building a new converter structure.

In addition to carrying out the characterisation process, the first modules 44 may be further configured to provide one or more additional functions such as active power damping and filtering with increased dynamic bandwidth, electrical fault management, module redundancy, and electrical impedance emulation in steady-state operating conditions, without interfering with the normal operating mode of the voltage source converter 20 carried out by the second modules 44. The higher switching frequency capability of the SiC based switching elements of the first modules 44 enables the first modules 44 to provide better active damping in comparison to the second modules 44 that has Si semiconductor based switching elements with lower switching frequency capability. Hence, the first modules 44 are capable of actively damping higher frequency oscillations in the AC network 40 that cannot be handled by the second modules 44.

Preferences and options for a given aspect, feature or parameter of the invention should, unless the context indicates otherwise, be regarded as having been disclosed in combination with any and all preferences and options for all other aspects, features and parameters of the invention.

The invention claimed is:

1. An electrical assembly comprising a converter for connection to an electrical network, the converter comprising at least one first module and at least one second module, each at least one first module and each at least one second module including at least one switching element and at least one energy storage device, the or each switching element and the or each energy storage device in each at least one first module and each at least one second module arranged to be combinable to selectively provide a voltage source, the electrical assembly including a controller configured to selectively control switching of the or each switching element in each at least one first module and each at least one second module, wherein the electrical assembly includes a sensor configured for measuring a current of the electrical network, wherein the controller and sensor are configured to operate in coordination to carry out a characterization of an electrical parameter of the electrical network so that, in use:

the controller selectively controls the switching of the or each switching element in each at least one first module to modify an electrical parameter of the converter so as to modify the current of the electrical network;

the sensor measures a resultant modified current of the electrical network; and the controller processes the measured resultant modified current of the electrical network so as to characterize the electrical parameter of the electrical network;

wherein the controller is configured to selectively control switching of the or each switching element in each at least one first module to carry out the characterization of the electrical parameter of the electrical network, wherein the controller is configured to selectively control switching of the or each switching element in each at least one second module to carry out a normal operating mode of the converter, and wherein the or each switching element of each at least one first module has a higher switching frequency capability than the or each switching element of each at least one second module.

2. The electrical assembly of claim 1, wherein the controller is configured to process the characterized electrical parameter of the electrical network to control the switching of the or each switching element in each at least one first module and each at least one second module so as to adapt control of the converter.

3. The electrical assembly of claim 2, wherein the controller is configured to process the characterized electrical parameter of the electrical network to control the switching of the or each switching element in each at least one first module and each at least one second module so as to adapt control of the converter by carrying out at least one of:

modifying an equivalent electrical impedance of the converter;

modifying a control parameter of the converter;

providing or increasing active damping of one or more oscillations in the electrical network; and providing active filtering.

4. The electrical assembly of claim 1, wherein the controller is configured to process the measured resultant modified current of the electrical network so as to characterize one or more of an electrical impedance of the electrical network and an operating voltage of the electrical network.

5. The electrical assembly of claim 1, wherein the controller is configured to selectively control the switching of the or each switching element in each at least one first module to provide a variable electrical impedance to modify an electrical impedance of the converter so as to modify the current of the electrical network.

6. The electrical assembly of claim 1, wherein the controller is configured to selectively control the switching of the or each switching element in each at least one first module to inject a perturbation voltage so as to modify the current of the electrical network.

7. The electrical assembly of claim 1, wherein the controller and sensor are configured to operate in coordination to carry out the characterization of the electrical parameter of the electrical network over a range of frequencies.

8. The electrical assembly of claim 1, wherein each at least one first module is configured to be bypassable during a normal operating mode of the converter.

9. An electrical assembly comprising a converter for connection to an electrical network, the converter comprising at least one module including at least one switching element and at least one energy storage device, the or each switching element and the or each energy storage device in the or each module arranged to be combinable to selectively provide a voltage source, the electrical assembly including a controller configured to selectively control switching of the or each switching element in the or each module, wherein the electrical assembly includes a sensor configured for measuring a current of the electrical network, wherein the controller and sensor are configured to operate in coordination to carry out a characterization of an electrical parameter of the electrical network so that, in use:
the controller selectively controls the switching of the or each switching element in the or each module to modify an electrical parameter of the converter so as to modify the current of the electrical network;
the sensor measures a resultant modified current of the electrical network; and
the controller processes the measured resultant modified current of the electrical network so as to characterize the electrical parameter of the electrical network;
further including at least one first module and at least one second module, wherein the controller is configured to selectively control switching of the or each switching element in the or each first module to carry out the characterization of the electrical parameter of the electrical network, and wherein the controller is configured to selectively control switching of the or each switching element in the or each second module to carry out a normal operating mode of the converter:
wherein the or each switching element of each at least one first module has a higher switching frequency capability than the or each switching element of each at least one second module.

10. A method of operating an electrical assembly to characterize an electrical parameter of an electrical network, the electrical assembly comprising a converter for connection to the electrical network, the converter comprising at least one first module and at least one second module including at least one switching element and at least one energy storage device, the or each switching element and the or each energy storage device in each at least one first module and each at least one second module arranged to be combinable to selectively provide a voltage source, wherein the method comprises:
controlling switching of the or each switching element in each at least one module to modify an electrical parameter of the converter so as to modify a current of the electrical network;
measuring a resultant modified current of the electrical network; and
processing the measured resultant modified current of the electrical network so as to characterize the electrical parameter of the electrical network;
wherein the method additionally comprises the steps of:
controlling the switching of the or each switching element in each at least one first module to carry out the characterization of the electrical parameter of the electrical network; and
controlling the switching of the or each switching element in each at least one second module to carry out a normal operating mode of the converter,
wherein the or each switching element of each at least one first module has a higher switching frequency capability than the or each switching element of each at least one second module.

* * * * *